United States Patent [19]

Walmet et al.

[11] 3,852,803

[45] Dec. 3, 1974

[54] HEAT SINK COOLED POWER SEMICONDUCTOR DEVICE ASSEMBLY HAVING LIQUID METAL INTERFACE

[75] Inventors: Gunnar E. Walmet, Schenectady; James C. Corman; Michael H. McLaughlin, both of Scotia, all of N.Y.

[73] Assignee: General Electric Company, Schenectady, N.Y.

[22] Filed: June 18, 1973

[21] Appl. No.: 370,838

[52] U.S. Cl. .................... 357/82, 165/80, 165/105, 174/15, 357/79

[51] Int. Cl. .......................... H01l 3/00, H01l 5/00

[58] Field of Search ................ 317/234, 1, 1.5, 6, 5; 174/15; 165/80, 105; 62/119

[56] References Cited

UNITED STATES PATENTS

| | | | |
|---|---|---|---|
| 3,226,608 | 12/1965 | Coffin | 317/234 J |
| 3,248,615 | 4/1966 | Weisshaar et al. | 317/234 J |
| 3,673,306 | 6/1972 | Kirkpatrick | 317/234 B |
| 3,736,474 | 5/1973 | Sias | 317/234 P |
| 3,739,234 | 6/1973 | Bylund et al. | 317/234 B |
| 3,739,235 | 6/1973 | Kessler | 317/234 B |
| 3,746,947 | 7/1973 | Yamamoto et al. | 317/234 A |

*Primary Examiner*—Andrew J. James
*Attorney, Agent, or Firm*—Louis A. Moucha; Joseph T. Cohen; Jerome C. Squillaro

[57] ABSTRACT

A power semiconductor device is bonded between thin metallic cup members and the edges of the assembly are provided with an electrical insulator to form the necessary creepage path. Liquid metal interfaces are provided between the cup members and heat sinks to provide high thermal and electrical conductivity joints therebetween. Since the liquid metal joint transmits heat and electricity, there is no need for high pressure joints, and since it does not permit a shear stress to be transmitted from the heat sink to the thin and fragile semiconductor device-cup member assembly, then the assembly is not stressed as with a high pressure joint. The excellent thermal characteristics of the joints result in reduced steady-state thermal resistance and improved transient response of the thin assembly and liquid metal interfaces.

28 Claims, 4 Drawing Figures

PATENTED DEC 3 1974

3,852,803

SHEET 1 OF 2

HEAT SINK COOLED POWER SEMICONDUCTOR DEVICE ASSEMBLY HAVING LIQUID METAL INTERFACE

Our invention relates to a thin assembly for cooling power semiconductor devices, and in particular, to a thin assembly which includes liquid metal interfaces between the semiconductor device and heat sinks, and as a result substantially improves the transient response and reduces the steady-state thermal resistance thereof.

Semiconductor devices of various types are constantly being fabricated in larger sizes for power applications as distinguished from signal applications. The larger size of the device and higher current and power rating thereof requires an efficient means for removal of the heat generated within the device to maintain operation thereof within its rated steady-state and transient temperature limits. Since the future trend undoubtedly will be to increase the power rating of semiconductor devices even beyond those presently utilized, it is readily apparent that more efficient cooling means must be provided for such power devices.

Conventional cooling systems for power semiconductor devices are generally in the form of a finned heat sink which uses conduction heat transfer within the body of the heat sink as the means for transferring heat from the semiconductor device.

More recently developed devices for cooling power semiconductor devices are heat pipes which effect heat transfer by vaporization of a liquid phase of a two-phase fluid coolant contained within a sealed chamber or pipe, by the application of heat to a vaporization, or evaporator, section of the chamber. The vaporization section of the heat pipe thus receives heat from the device being cooled and the heated vapor, being under a relatively higher vapor pressure, moves to the lower pressure area in the condensation section of the chamber, or pipe, by a substantially isothermal process wherein the vapor condenses and the condensate returns to the evaporator section to be vaporized again and, thus repeat the heat transfer cycle. The condenser section of the heat pipe is, in effect, an air-cooled surface condenser functioning to reject heat to ambient air. A wick material disposed along substantially the entire inner surface of the heat pipe is conventionally used to pump the condensate to the vaporization section of the heat pipe by capillary action. Since the heat pipe does not utilize conduction as the heat transfer process (except for transferring the heat into and out of the heat pipe), it thereby overcomes a limitation inherent with the conventional finned heat sink due to its reduced efficiency of conduction heat transfer with increased path length, and suggests that the heat pipe may be a superior type device for use in cooling power semiconductor devices. The first use of heat-pipe cooling of power semiconductor devices known to us is by Heat-Pipe Corporation of America of Westfield, New Jersey whose sales brochure generally describes heat pipes as being used to transport heat from electric motors, semiconductors, brakes and clutches and other heat producing devices. A publication prepared by the RCA Corporation at Lancaster, Pa. as a final technical report under contract DAAK02-69-C-0609 dated October 1972 discloses wicked heat-pipe cooled semiconductor thyristor devices in which the wick is in direct contact with the semiconductor device. This assembly, however, does not have the capability available in our invention for removal of the semiconductor device, that is, if the semiconductor device must be replaced, the heat pipe is also lost since the wick is integral therewith. Also, such heat pipe has limited power density due to the wick. Finally, a heat-pipe cooling of power semiconductor devices is also disclosed in a paper entitled "Application of Heat Pipes to the Cooling of Power Semiconductors" by Edward J. Kroliczek of the Dynatherm Corporation of Cockeysville, Md. which describes the mounting of a power semiconductor device to a heat pipe assembly which uses two heat pipes for single-sided cooling, each being of small size in cross-section and of flat configuration which significantly increases the thermal resistance. The orientation of the small heat pipes relative to the large cooling fins in the Dynatherm assembly also results in poor heat distribution since conduction heat transfer is required in transferring the heat laterally from the edges of the heat pipes to the outer portions of the fins.

Copending patent applications Ser. No. 356,566 entitled "Heat-Pipe Cooled Power Semiconductor Device Assembly" and Ser. No. 356,565 entitled "Improved Double-Sided Heat Pipe Cooled Power Semiconductor Device Assembly," inventors Corman et al, filed on May 2, 1973 and assigned to the same assignee as the present invention are directed to heat-pipe cooling of power semiconductor devices using nonwicked heat pipes of the gravity-return type. However, in such applications, the semiconductor device is clamped between two pressure plates of relatively large size under high pressure in order to obtain pressure interfaces which result in relatively low steady-state thermal resistance as well as decreasing the transient temperature rise for long term heat overloads. Although the inventions described in the above two identified patent applications are completely satisfactory, there are applications wherein it is desirable to form the semiconductor device and its support assembly as a thinner unit requiring no high pressure interface in order to improve the transient response thereof as well as obtain a further reduction in the steady-state thermal resistance. Also, since clamping forces in the range of 6 to 8 tons may be required for power semiconductor devices in the 100 mm diameter size range, the cost and mechanical complexity of the clamp are quite significant.

Liquid metal joints are known in applications such as mercury wetted slip rings. A U.S. Pat. No. 3,226,608, issued Dec. 28, 1965 to L.F. Coffin, Jr. on a "Liquid Metal Electrical Connection," and assigned to the assignee of the present invention is directed to the use of liquid metal for connecting the tungsten or molybdenum discs of a high current silicon rectifier to conductors integral with the interior of the rectifier. However, this patent is concerned with internal integral electrical connections provided by the liquid metal and does not suggest the use of the liquid metal joints being used as a heat transfer medium for the purpose of interfacing a replaceable rectifier or other thin fragile unit with heat sinks to thereby eliminate high pressure joints which would ordinarily be necessary for efficient (low thermal resistance) heat transfer. Thus, our liquid metal interfaces are external of the semiconductor device whereas the Coffin interfaces are internal thereof.

Therefore, one of the principal objects of our invention is to provide an improved cooling system for power semiconductor devices which is superior to conventional cooling systems both on a steady-state and transient basis.

A further object of our invention is to provide the improved cooling system with a thin unit comprising the semiconductor device and interface with the heat sink in order to achieve a lower steady-state thermal resistance.

Another object of our invention is to provide the improved cooling system with reduced thermal resistance in the immediate vicinity of the body of semiconductor material for improving the transient response of the cooling system.

A still further object of our invention is to eliminate the need for high contact pressure in clamping the thin semiconductor device-interface unit to the heat sink.

Another object of our invention is to provide the improved cooling system with the capability for having the power semiconductor device be a readily replaceable unit.

Briefly summarized, and in accordance with the objects of our invention, we provide an improved cooling system for power semiconductor devices which includes an integral unit including a power semiconductor device bonded between two thin metalllic cup members and having electrical insulation along the sides of the assembly for providing an increased creepage path across the semiconductor device. Liquid metal interfaces are provided between the metallic cup members and heat sinks, and only a low clamping force is required for retaining the two heat sinks and integral semiconductor device-cup member unit and liquid metal interfaces in an assembly wherein the integral unit is readily replaceable. The liquid interfaces are thin films of a metal such as a low melting point alloy of indium, tin, lead, antomony, bismuth and cadmium as one typical example. The liquid metal interfaces provide high thermal and electrical conductivity joints between the cup members and heat sinks, and the presence of the liquid metal interfaces and absence of high pressure joints (interfaces) prevents stress of the thin and fragile semiconductor device-metallic cup member unit during temperature excursion. The heat sinks can be conventional air cooled finned or water cooled heat sinks, wicked heat pipes or nonwicked heat pipes of the gravity-return type as typical examples. In the case of the more efficient nonwicked heat pipe, the evaporating surface thereof may be enhanced by sintering a thin porous metallic structure thereto. Alternatively, a thin, irregular surface formed by a plurality of metallic members such as small fins or posts can be joined to the evaporating surface of the heat pipe for enhancement thereof. Due to the thin nature of the integral semiconductor device-cup member unit, and liquid metal interfaces, and absence of any dry pressure interfaces, the steady-state thermal resistance as well as the transient response measured from the body of semiconductor material to the heat sinks are significantly improved to thereby produce improved cooling of the semiconductor device.

The features of our invention which we desire to protect herein are pointed out with particularity in the appended claims. The invention itself, however, both as to its organization and method of operation, together with further objects and advantages thereof may best be understood by reference to the following description taken in connection with the accompanying drawings wherein like parts in each of the several figures are identified by the same reference character, and wherein:

Figures 1, 2:
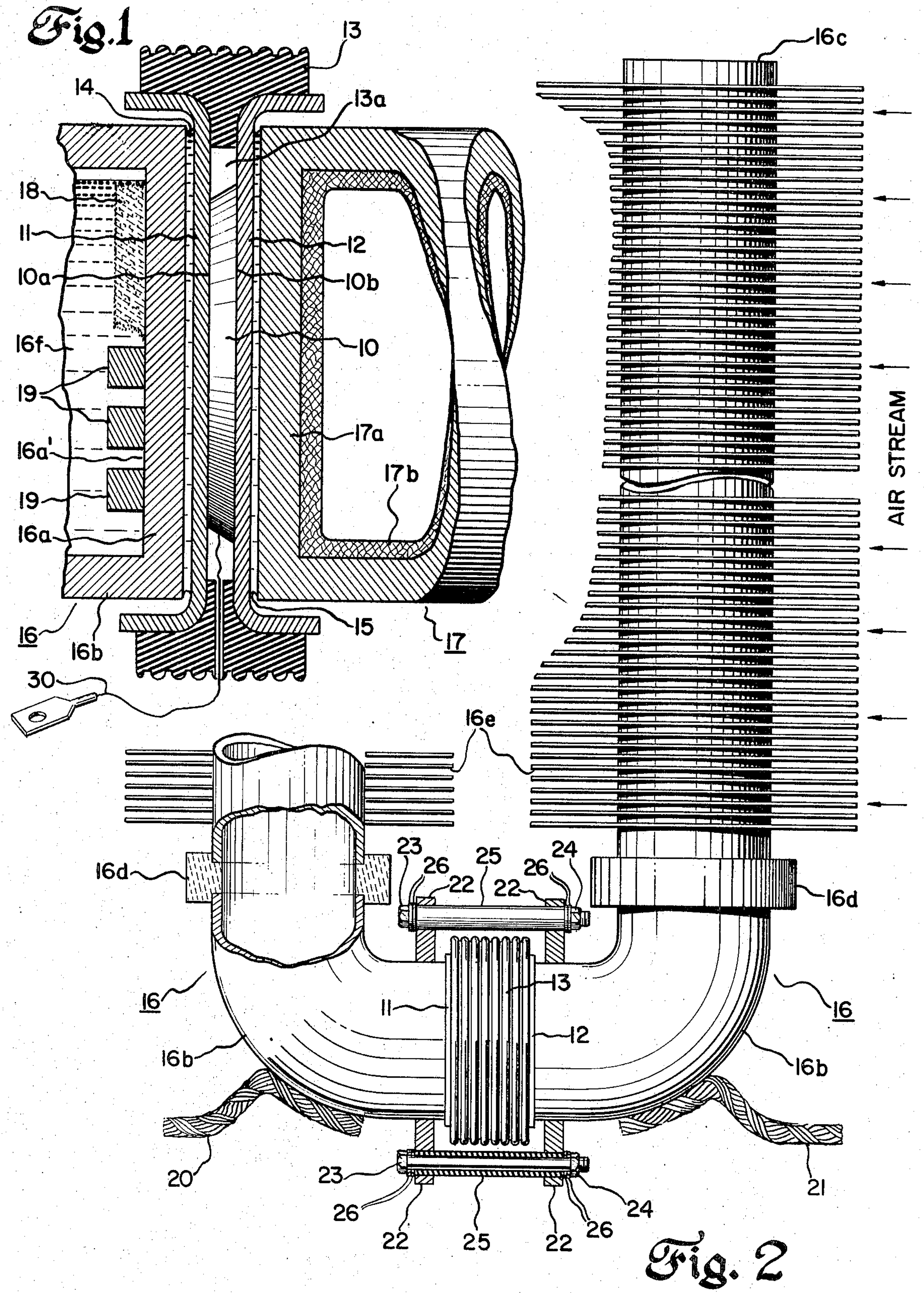
FIG. 1 is an enlarged elevation view, partly in section, of the integral power semiconductor device-metallic cup member unit assembled with a portion of a nonwicked heat pipe having two different types of evaporating surface enhancement means, and a wicked heat pipe.
FIG. 2 is an elevation view, partly in section, of a greater portion of the assembly than that illustrated in FIG. 1, and showing a typical means for clamping the two heat pipes together with a low clamping force.

Referring now in particular to FIG. 1, there is shown the details of our invention wherein a power semiconductor device 10 is bonded between two thin metallic cup-like members 11 and 12. The power semiconductor device is defined herein as being a device which develops a thermal density of at least 100 watts per square inch along the surfaces thereof. Power semiconductor device 10 is a body of semiconductor material having first and second flat parallel major surfaces 10*a* and 10*b*, respectively, which define the body of semiconductor material therebetween. The fragile silicon junctions of body 10 would conventionally be protected against thermal and mechanical stresses by having one of the major surfaces in pressure contact with a substantial support plate fabricated of tungsten or molybdenum as two typical metals, and the second major surface brazed or otherwise bonded to a second support plate as is the case in the two above-identified patent applications. Such conventional arrangement prevents cracking or other damage to the semiconductor body which could result from thermal expansion stresses caused by the excursion in junction temperature during transient operation which may be in the order of 200°C. Further, the support plate-semiconductor body layered device described in the two above-identified patent applications is retained in high pressure contact between two pressure plates which are clamped together for exerting a high pressure in the order of 2000 pounds per square inch uniformly against the power semiconductor device. Such high pressure results in relatively low thermal and electrical pressure interface resistances in the order of 0.015 °C-inch $^2$/watt and 20 $\times 10^{-6}$ ohm, respectively. Typical dimensions of the above-described pressure interface portion of a heat-sink cooled power semiconductor device assembly are: the body of semiconductor material has a thickness of 10 mils and a diameter of 2000 mils for a 700 ampere, 1200 volt rated semiconductor device, the support plates are each of 40 mils thickness, and the pressure plates are each of 100 to 300 mils thickness. The pressure plates have significant heat storage capabilities due to their relative size and they cause a dampening of thermal transients that may occur. However, the presence of pressure interfaces between the pressure plates and support plates, and between one of the support plates and semiconductor body limits the minimum overall silicon junction-to-ambient thermal and electrical resistances that can be achieved in the above-described power semiconductor device cooling system. Our invention is directed to the elimination of such pressure interfaces.

As distinguished from the above-described pressure interface portion of a heat-sink cooled power semiconductor device assembly, our invention eliminates the above-described pressure interfaces in the following manner. Major surfaces 10*a* and 10*b* of semiconductor body 10 are respectively brazed, soldered or otherwise bonded to the outer bottom surfaces of two very thin cup-like members 11 and 12 fabricated of a good thermally and electrically conductive high strength material having a coefficient of thermal expansion substantially equal to that of the semiconductor material. In the case of a silicon semiconductor body, 10, cup members 11, 12 may be fabricated of molybdenum or tungsten as two typical metals. For the case of the above-described 700 ampere, 1200 volt rated semiconductor device, the thickness of each cup member 11 and 12 is generally in a range of 2 to 6 mils. It is the thinness of this dimension which avoids the build-up of thermal expansion stresses at the semiconductor body-cup member interfaces and thereby permits solid bonding type connections to be made rather than having to use a pressure interface The outer side wall portions of cup members 11 and 12 provide support for a creepage path lengthening means 13 which is a rubber, a ceramic or other electrically insulating material formed along substantially the full height of the side walls of cup members 11 and 12 for increasing the creepage path across the semiconductor device 10. The increased creepage path means 13 may be a ceramic composition, or a silicone rubber composition such as the type RTV produced by the General Electric Company and is preferably formed with an irregular outer surface to obtain an even greater creepage path to prevent arc-over between the cup members. In the case of a silicone rubber composition, it preferably entirely fills the void between cup members 11 and 12 to thereby also provide a dirt-free seal around power semiconductor device 10 and such rubber composition is then run along the outer side surfaces of the cup members to obtain the increased creepage path between the cup members and across the semiconductor device. In the case of a ceramic composition, as shown in FIG. 1, the ceramic need not fill the entire void between the cup members 11 and 12, and may have a straight bore inner diameter and the remaining space 13*a* between the cup members is preferably back-filled with an inert gas such as nitrogen, or may be filled with silicone rubber. The increased creepage path means 13, cup members 11 and 12, and power semiconductor device 10 thus form a thin integral structure which hereinafter will be described as the integral semiconductor device-cup member unit. The need for increasing the creepage path between cup members 11 and 12 should be evident in view of the small thickness of the integral unit which may be as small as 14 mils for the above-described dimensions (cup thickness of 2 mils each) and typical semiconductor device anode-to-cathode potentials of 1200 volts.

The heat conducted from semiconductor device 10 through cup members 11 and 12 (double-sided cooling will be assumed herein) during operation of device 10 requires suitable heat sinks in order to obtain the necessary heat exchange from the cup members to the ambient air. The heat sink can be the conventional type such as air cooled solid finned heat sink (illustrated in FIGS. 3 and 4) or liquid cooled heat sink which uses conduction heat transfer as the means for transferring heat a short distance from the semiconductor device to a cooling passage or a number of cooling passages and thence to ambient, or can be the more recently developed heat pipe which uses vapor phase heat transfer. In either case, suitable interfaces are required between the inner bottom surfaces of cup members 11, 12 and the heat sinks. In the case of the two above-noted patent applications, the interfaces are high pressure interfaces as mentioned above. In our present invention, we eliminate the high pressure interfaces by utilizing liquid metal interfaces 14 and 15 respectively between cup members 11 and 12 and the heat sinks. The liquid metal interfaces 14 and 15 are thin films of a metal which is a liquid at least at the operating temperature for the semiconductor device, and may be in a liquid or solid state during nonoperating conditions. The metal or metals selected to be used in our liquid metal interfaces must have high thermal conductivity for efficient heat transfer from the cup members to the heat sink and must have high electrical conductivity since the electric power connections for supplying power to the semiconductor device are made external of the integral semiconductor device-cup member unit. Our liquid metal interfaces may be formed from low melting temperature eutectic alloys of various combinations of particular metals or from a low melting temperature pure metal. The metal or alloy of metals must also have high metallurgical wetting characteristics in order to provide initial adhesion of the metal to the surfaces of the cup members and heat pipe end surfaces and to develop sufficient capilllary forces to keep the liquid metal in the joint. The particular liquid metal or alloy of metals selected must also have compatibility with the metal of the cup members which clads the semiconductor body and also with the metal forming the heat sinks. Two typical examples of the metals that may be used in the eutectic alloy of various combinations of metals are sodium and potassium (NaK) as one, and indium, tin, lead, antimony, bismuth and cadmium as another. A low melting temperature pure metal with high metallurgical wetting characteristics that may be utilized is gallium. The thickness of the liquid metal interface 14 or 15 is in a range of 1/10 to 5 mils and preferably is in the range less than 1 mil.

The liquid metal joints greatly simplify the semiconductor device cooling assembly since the high thermal and electrical conductivity of the liquid metal, and the fact that the liquid joint will not mechanically stress the fragile semiconductor device-cup member assembly makes possible the cooling of large diameter semiconductor devices without the need for large forces to obtain high pressure joints. The advantage of not having to apply high clamping forces is especially significant when, as herein, it is desired to make both the integral unit and heat pipe walls as thin as possible to reduce steady-state thermal resistance and improve transient response. Since the liquid metal joints transmit heat and electricity, there is no need for high pressure joints. And since the liquid metal joints do not permit shear stress to be transmitted from the heat sinks to the thin and fragile semiconductor device-cup member unit, then the unit is not stressed as with high pressure joints. Thus, since the semiconductor device-cup member unit is thin and contains no dry pressure joints, and the assembly including the integral semiconductor device-cup member unit and liquid metal interfaces does not require high contact pressure, this results in substantially reduced thermal resistance in the immediate vicinity of the semiconductor body. This substantially reduced thermal resistance in the immediate vicinity of the semiconductor body results in both the steady-state and transient thermal resistances being substantially reduced and therefore improves both the steady-state and transient characteristics of the assembly. As indicated in FIG. 2, only a very low clamping force is required to retain the two heat sinks in contact with the liquid metal interfaces and integral semiconductor device-cup member unit. This low clamping force also results in the use of a much less costly and less mechanically complex clamp device than utilized in the high clamping force applications.

In FIG. 1, the liquid metal interfaces 14 and 15 are shown in contact with the evaporator section end walls 16*a* and 17*a*, respectively, of two heat pipes illustrated as a whole by the numerals 16 and 17.

The heat pipes 16 and 17, shown in greater detail in FIG. 2, are each a sealed chamber or pipe which includes a vaporization or evaporator section that is placed in contact with the source of heat (the semiconductor device to be cooled) and a condensation section which is at the opposite end of the chamber and may be separated by a distance therefrom up to several feet. A two-phase fluid coolant is contained within the heat pipes and effects heat transfer by vaporization of a liquid phase of the coolant resulting from heat conduction from the power semiconductor device 10 through cup members 11, 12 and liquid metal interfaces 14, 15 to the evaporator section 16*a*, 17*a* of the heat pipes. The vaporization section of each heat pipe thus receives heat from the device being cooled and the heated vapor, being under a relatively higher vapor pressure, moves to the lower pressure area in the condensation section of the heat pipe which functions as a surface condenser where the vapor condenses and the condensate returns to the evaporator section to be vaporized again and, thus repeats the heat transfer cycle. The condensation section of each heat pipe has a relatively high thermal mass due to the large surface area thereof, is preferably provided with a finned heat exchanger to thereby function as an air-cooled surface condenser rejecting heat to ambient air which surrounds the condensation section. For more efficient removal of the heat to the ambient air, a fan or other means is utilized for obtaining forced air cooling by developing a sufficient air velocity of the ambient air passing by the cooling fins as depicted by the arrows in FIG. 2. In conventional heat pipes, i.e., wicked heat pipes such as heat pipe 17 in FIG. 1, the heat pipe is generally oriented horizontally and a capillary pumping structure, or wick 17*b*, is saturated with the liquid phase of the coolant and is used to "pump" the condensate to the evaporator section of the heat pipe by capillary action.

However, a wick is not essential to the operation of a heat pipe when it is of the gravity-feed type such as heat pipe 16 in FIG. 1, that is, the heat pipe is oriented at some angle from the horizontal which need not be the extreme case of 90° indicated in FIG. 2. Each of the heat pipes illustrated in each of the above-identified publications is shown in a horizontal orientation, and, as such, require the wick for pumping the condensed fluid from the condensation section to the evaporator section. In the gravity-feed heat pipe, the condensed fluid returns to the evaporator section by gravity. The omission of the wick material along the various inner surfaces of the gravity-feed heat pipe results in reduced thermal resistance since the wick adds another thermal resistance (loss) component into the system. Further, the use of a wicked heat pipe limits the effective length of the heat pipe that may be used since the pumping losses associated with the wick increase with heat pipe length. For these reasons, a preferred embodiment of our cooling system employs the gravity-return heat pipes as illustrated in FIG. 2, and as a result obtains more efficient cooling, although the wicked heat pipes may alternatively be used, if desired. It should be understood that the same type heat pipes would generally be used for double-sided cooling, as illustrated in FIG. 2, and FIG. 1 is used merely to illustrate the different structure of the evaporator sections of the nonwicked 16 and wicked 17 heat pipes.

Since the evaporating section (boiling surface) of the gravity-feed (nonwicked) heat pipes is relatively small compared to the large surface area in the condensing section, it is desirable to increase such boiling (evaporating) surface area and/or change the local fluid flow patterns in order to obtain a greater maximum heat rejection rate through liquid metal interfaces 14, 15 from cup members 11, 12 (and therefore also from semiconductor device 10.) Therefore, for purposes of enhancing (increasing) the vaporization rate in the nonwicked heat pipes 16, a "boiling surface" enhancement means is formed along the evaporating surface 16*a'* of each nonwicked heat pipe 16. This boiling surface enhancement means may be layer structure 18 of generally uniform thickness in a range of 10 to 50 mils of a porous metallic material such as FOAMETAL, a product of Hogen Industries, Willoughby, Ohio, which is nickel as one typical example having a selected porosity in the range of about 60 to 95 percent and is sintered or otherwise joined to the heat pipe evaporating surface 16*a'* for changing the local fluid flow pattern. Layer 18 may also be formed of porous copper or stainless steel, the latter metal not being used when the coolant is water. Alternatively, this evaporating surface enhancement means is a thin irregular surface 19 formed by a plurality of small solid metallic members such as cylindrical or square posts or small finned surfaces (short finned structure) which are suitably joined to the evaporating surface 16*a'* of each gravity-feed heat pipe 16 for increasing the evaporating surface area. Obviously, the same evaporating surface enhancement means (18 or 19) is generally used in both gravity-feed heat pipes in any one double-sided cooling application, and the illustration of the two different enhancement means in the heat pipe 16 of FIG. 1 is merely to indicate two typical types (18 or 19) that can be used. The irregular surface 19 in the form of the various type projecting members or short fins may be formed of the same metals as used in the layer structure 18, that is, nickel, copper or stainless steel, as typical examples, or may be of the same or different metals as used in the cup members 11, 12. Such irregular surface metallic members would generally be separately fabricated and then joined to the heat pipe evaporating surfaces by sintering, low temperature brazing, or powdered metallurgy techniques as three examples. The heat pipe evaporating section end 16*a*-irregular surface 19 may even be integrally fabricated and end 16*a* then is brazed or otherwise joined to the side surfaces 16b of the heat pipe. As a typical example of the dimensions of the irregular surface members, they may be 0.15 inch in height, and 0.10 inch square along the top (outermost) surface and 0.15 inch center-to-center spacing between adjacent members, and would generally cover the entire evaporating surface of each gravity-feed heat pipe 16. These projecting members (18 or 19) project outwardly from the evaporating surface 16a' normal thereto, and various other geometry type members could also obviously be utilized.

Since heat pipes do not utilize conduction as the heat transfer process (except for transferring the heat into and out of the heat pipe walls), and since the heat transfer through the length of each heat pipe is a substantially isothermal process of evaporation and condensation, then the condensation section of the heat pipe is at substantially the same temperature as the evaporation section except for the vaporization temperature change. This heat transfer process is also known as vapor phase heat transfer. The most distinguishing feature of the heat pipe over the conventional air cooled finned or water cooled heat sink is its ability to transfer heat along its length with substantially no temperature change and thereby is much more efficient in its cooling ability than the conventional heat sink.

In FIG. 2, the two gravity-feed heat pipes 16 are each illustrated as being vertically oriented (although as mentioned above, such orientation may be much less than 90° from the horizontal) and the sealed chambers of the heat pipes are defined by the side walls 16b, evaporating section end walls 16a at one end, and a suitable plug 16c at each condenser section end. The heat pipe may be circular, square or rectangular as typical examples of the cross section thereof. Power conductors 20 and 21 are suitably soldered or in other suitable manner connected to corresponding side surfaces 16b of heat pipes 16 adjacent the evaporator section ends thereof for supplying electrical power to the semiconductor device 10. The side wall 16b of each heat pipe is fabricated of a metal having a high thermal conductivity such as copper, and has a thickness in the order of 40 mils. As a typical example, for a power semiconductor device having a steady-state electrical current rating of 700 amperes, each heat pipe is 8 inches in length and 1.5 square inches in cross-sectional area. The plug 16c may be fabricated of a compatible material such as copper and is suitably connected to the condenser section end of the heat pipe by brazing or any other well known metal joining process that assures a sealed chamber within the heat pipe. The side walls 16b of the heat pipes are also soldered, brazed or otherwise joined to the evaporating section end walls 16a to provide the proper seals therewith. The side walls 16b may be provided with electrically insulating collars 16d adjacent the evaporator section ends of the heat pipes in order to insulate the finned condensation sections of the heat pipes from the voltages applied through conductors 20, 21 to the semiconductor device 10 via the adjacent lower-most portions of the heat pipe side walls if such isolation is desired. Thus, each side wall 16b is generally in two (or more) sections separated by the insulating collar 16d. In the case of rectangular (or even square) cross section heat pipes (not shown), the end portion of each heat pipe which terminates in the evaporating surface end wall 16a is preferably circular in cross-section and is horizontally oriented. This circular end portion of the heat pipe would be brazed or otherwise joined along the edges of a circular hole formed in the wider dimension side of the heat pipe adjacent the rectangular (or square) cross section base portion of the heat pipe.

The finned heat exchanger along the outer surface of the condensation section of each heat pipe consists of large fins 16e which may be of the folded fin or plate fin types and are fabricated of a high thermal conductivity material such as copper. The fins extend outward from the side walls of each heat pipe a distance generally in the range of 0.5 to 1.0 of the diameter dimension (for circular cross section heat pipes) and 0.5 to 1.0 of the distance between opposing walls (for square or rectangular cross section) to which they are connected. For ease of fabrication, the heat pipe is often rectangular in cross section and the cooling fins are of length equal to the long dimension side of the heat pipe and are attached therealong.

The liquid state 16f of the two-phase fluid coolant in the gravity-feed pipe 16 is of small volume, and merely of sufficient depth in the evaporator section of each gravity-feed heat pipe to fully immerse the "heated" portion of the boiling surface enhancement means 18(or 19). In the case of the wicked heat pipe 17, the volume of the liquid state of the coolant is usually merely sufficient to saturate the wick material 17b. The coolant 16f may be water, or a freon refrigerant, as typical examples. In the case wherein the power semiconductor device is of the three electrode type, the third electrode (generally described as the gate or control electrode) is provided with connection to a third electrical conductor 30 which may be brought out at the side of device 10 and through the increased creepage path means 13.

Referring now specifically to FIG. 2, there is shown a nonpermanent type of connection of the integral semiconductor device-cup member unit (and liquid metal interfaces) between the evaporating section end walls of the heat pipes. Thus, a clamping means provides a low clamping force as low as 10 pounds for retaining the two circular end portions of the two heat pipes in assembly with the integral semiconductor device-cup member unit and liquid metal interfaces. This clamping force is not required to develop any pressure interface(s) between the two heat pipes and semiconductor device since the liquid metal interfaces can function substantially pressure-free. The evaporator section end portions of the heat pipes have formed peripherally along the circular outer surfaces thereof two washer-like projecting members 22 which are lightly clamped together by means of a plurality of metallic nut-bolt assemblies as one typical example. Thus, bolts 23 pass through aligned holes in projecting members 22, and nuts 24 are tightened on the bolt ends sufficiently merely to apply the low clamping force to the assembly. Each bolt 23 is provided with a suitable electrically insulating jacket 25 and insulating washers 26 to prevent electrical short-circuiting across the heat pipe ends through the bolts. If desired, the electrical power conductors 20 and 21 may alternatively be suitably connected to the projecting members 22 by being soldered to terminals connected thereto or to extending tab portions formed thereon as two examples. The bolt ring assembly thus permits easy removal (and replacement) of the integral semiconductor device-cup member unit from between the two heat pipes.

The use of our thin integral semiconductor device-cup member unit and liquid metal interfaces results in a (silicon) junction-to-evaporating surface steady-state thermal resistance of approximately 0.006°C/watt (for 6 mil thickness molybdenum cup members) as compared to 0.036°C/watt for the embodiments described in the above-identified copending patent applications. This sharp reduction in steady-state thermal resistance is the result of the elimination of the high pressure interfaces and much smaller volume of metal used in our thin integral semiconductor device-cup member unit. The thinness of this unit thereby locates the heat pipe evaporating surface very close to the semiconductor body junction to minimize the transient response time of the unit and thereby produce a fast thermal response system. Obviously, the thinness of the unit results in some sacrifice for short time heat transients compared to another type unit having equally good thermal interfaces and sufficient volume of heat storage material since the heat storage capability of the thin cup members 11, 12 is limited. However, as compared to the units disclosed in the above-described copending patent applications, our thin integral unit and liquid metal interfaces provides superior performance for both short time and long time transients, as well as for steady-state since the superior thermal interfaces and lack of pressure interfaces in our unit more than overcome the limited heat storage capability. But in the case of molybdenum or tungsten cup members, the thickness thereof cannot much exceed 6 mils without resulting in thermal expansion stresses during operation of the assembly causing damage to the semiconductor body. However, the cup members may be made thicker to obtain higher heat storage capabilities, by fabricating them of "softer" metals such as aluminum or copper. In such case, the cup thickness may be as much as 10 mils without causing damage to the semiconductor body due to thermal expansion stresses. In the case of the aluminum or copper cup members, an alloy joint or thermal compression process may be required to obtain the desired bond between the semiconductor body 10 and cup members 11 and 12. Such alloy joint or thermal compression process may also be used when the cup members are fabricated of the "stiffer" molybdenum or tunsten metals.

Figure 3:
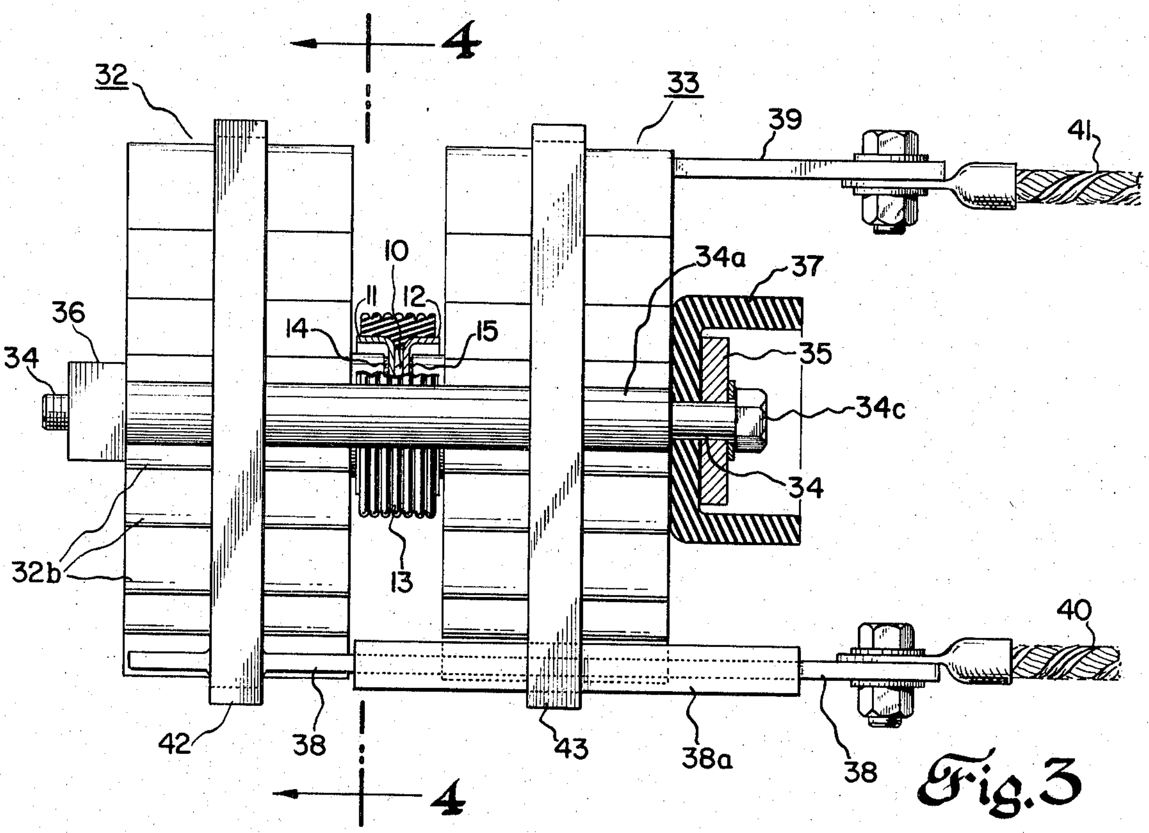
FIG. 3 is an elevation view, partly in section, of the integral power semiconductor device-metallic cup member unit assembled with conventional air cooled finned heat sinks.
Figure 4:
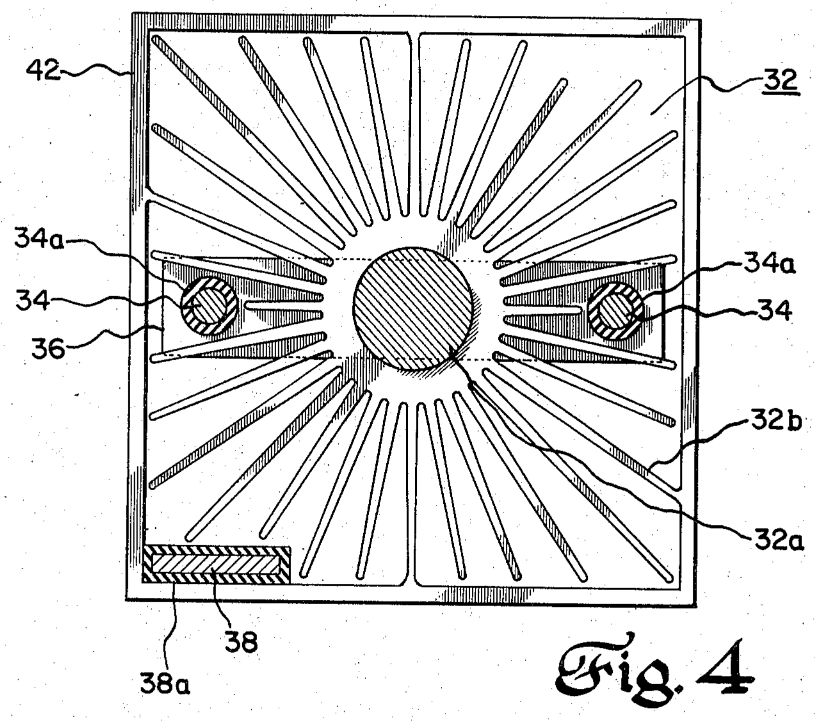
FIG. 4 is a sectional view, taken along line 4—4 in FIG. 3.

Referring now to FIGS. 3 and 4, there is shown an embodiment of our invention wherein the thin integral semiconductor device-cup member unit is retained in an assembly including two conventional air cooled finned heat sinks 32 and 33 with the liquid metal interfaces 14 and 15 therebetween. In FIG. 4, the thin integral semiconductor device-cup member unit is omitted. Each heat sink 32 and 33 includes a solid central portion 32*a* and radially extending fins 32*b* as seen more clearly in FIG. 4, and is fabricated of a good electrically conductive and heat conductive metal such as copper or aluminum as typical examples. The two heat sinks 32, 33 are retained in assembly with the integral unit and the liquid metal interfaces by clamping means including two rods 34 passing between corresponding fins along opposite sides of the assembly, and being connected together along the two outer ends of the assembly by cross members 35 and 36. Rods 34 and members 35, 36 may be metallic (at higher clamping loads) or nonmetallic (at lower clamping loads) and in the case of metallic rods, are suitably electrically insulated from the fins 32*b* such as by means of a rubber jacket 34*a*. Rods 34 are threaded at the ends passing through like-threaded holes in cross members 36. The head ends 34*c* of rods 34 pass through holes in cross member 35 which are aligned with the threaded holes in cross member 36. Plastic or other electrically insulating members 37 are mounted on rods 34 between heat sink 33 and cross member 35 for electrically insulating the rods (if metallic) from the end surface of the heat sink. Cross member 36 also functions as a nut for each of rods 34 to obtain the desired low clamping force as low as 10 pounds against the integral semiconductor device-cup member unit.

First and second electric power terminals 38 and 39 are brazed or otherwise joined to widely peripherally spaced apart fins on heat sinks 32 and 33, respectively. The terminals preferably extend from one end of the assembly parallel to rods 34 and the further extending terminal (38) is electrically insulated from the fins of heat sink 33 by means of a rubber or plastic jacket 38*a*. Since the power semiconductor device may have a rating of 700 amperes, 1200 volts as a typical example, the terminals 38 and 39 are of large cross-sectional area. Terminals 38 and 39 are fabricated of aluminum or copper as typical examples and the ends thereof remote from the heat sinks are suitably connected to power conductors 40 and 41, respectively. Finally, for convenience of mounting the heat sink-integral semiconductor device-cup member unit assembly on a rack or other apparatus and provide further rigidity to the assembly, two generally square shaped metal frame support members 42 and 43 are positioned around the outer edges of heat sinks 32 and 33, respectively. Frame member 42 is brazed or otherwise joined to outer edges of four or more widely peripherally spaced fins of heat sink 32, as well as to terminal 38. In like manner, frame member 43 is joined to fins of heat sink 33 and terminal 39. The outer surfaces of frame members 42 and 43 are electrically insulated and preferably provided with a coating of felt or other mechanically cushioning material which permits insertion and removal of the assembly from the mounting rack without scratching or otherwise marring the surfaces of the frame members or the rack.

The desirable features of our integral power semiconductor device-cup member unit and liquid metal interfaces also results in the conventional air cooled finned or water cooled heat sink embodiments of our invention having improved cooling capabilities both on a steady-state and transient basis.

It is apparent from the foregoing that our invention obtains the objectives set forth in that it provides a cooling system for power semiconductor devices which is significantly superior to the conventional air cooled finned or water cooled heat sink system as well as superior to the gravity-feed heat pipe systems described in the two aforementioned copending patent applications both as to its steady-state and transient response characteristics. The thin integral semiconductor device-cup member unit and liquid metal interfaces result in the elimination of pressure interfaces and therefore a much lower steady-state thermal resistance subassembly than those disclosed in the above-mentioned patent applications and especially provides reduced thermal resistance in the immediate vicinity of the body of semiconductor material. This decreased steady-state thermal resistance results in the ability, especially in the gravity-feed heat pipe embodiment of our invention, to transfer heat to the ambient with much greater efficiency than with conventional heat sinks or with the other heat-pipe cooled power semiconductor device assemblies enumerated above in the published art and copending patent applications and thereby obtains a lower operating temperature of the semiconductor device. And since the integral semiconductor device-cup member unit includes the increased creepage path means, less cost is involved when a heat sink must be replaced. Further, the use of the liquid metal joints simplifies the structure of the assembly since the high thermal and electrical conductivity of the liquid metal, and the fact that liquid joints won't mechanically stress the fragile integral power semiconductor device-cup member unit, permits cooling of large diameter power semiconductor devices without the need to utilize high pressure interfaces. This advantage of eliminating high clamping forces is especially significant in light of the objective of making the integral power semiconductor device-cup member unit as thin as possible to reduce steady-state thermal resistance and also to improve transient response. Finally, the electrically insulating collars 16*d* permit the forced air-cooled portions of our heat pipe assembly to be outside a cabinet in which the integral power semiconductor device-cup member unit may be mounted, and such finned portions 16*e* would thus be electrically isolated from the high voltage applied to the semiconductor body. Also, these electrically insulating collars permit the cooling fins 16*e* to be exposed to dirty air without the possibility of increased surface conduction along the creepage path around the semiconductor body that occurs with conventional extruded or nonextruded finned heat sinks or heat pipes not having such collars and operating in dirty air.

Having thus described several embodiments of our double-sided heat-sink cooled power semiconductor device assembly, it is believed obvious that modification and variation of such specific embodiments may readily be made by one skilled in the art. Thus, the assembly may readily be utilized as a single-sided cooled assembly by removing one of the heat sinks. It is, therefore, to be understood that changes may be made in the heat-sink cooled power semiconductor device assembly which are within the full intended scope of our invention as defined by the following claims.

What we claim as new and desire to secure by Letters Patent of the United States is:

1. A high pressure-interface-free heat-pipe cooled power semiconductor device assembly comprising a pressure-interface-free thin integral power semiconductor device-cup member unit including a power semiconductor device consisting of a body of semiconductor material defined by first and second flat parallel major surfaces, first and second thin cup-like members having outer bottom surfaces respectively bonded directly to the first and second flat parallel surfaces of the body of semiconductor material so that the integral power semiconductor device-cup member unit is pressure-interface-free, said cup-like members fabricated of a good electrically and thermally conductive material, and creepage path lengthening means formed along outer side wall portions of said cup-like members for increasing the creepage path across said power semiconductor device, said power semiconductor device defined as developing a thermal density of at least 100 watts per square inch of surface area, a first long nonwicked gravity-return heat pipe having an evaporating surface end wall in thermal contact with an inner bottom surface of said first cup-like member for removing heat therefrom, said first nonwicked gravity-return heat pipes comprising a first enclosed elongated hollow chamber having an evaporator section at a first end thereof respectively defined by the evaporating surface end wall and a condenser section at a second end thereof remote from the first end, and a two-phase fluid coolant contained within said first chamber and being of sufficient volume in the liquid state to cause full immersion of at least the heated portion of the evaporating surface, first and second electrical conductors respectively connected to said assembly for supplying electrical power to said power semiconductor device, a static first thin film of a high thermal and electrical conductivity metal disposed external of said integral semiconductor device-cup member unit between the inner bottom surface of said first cup-like member and evaporating surface end wall of said first heat pipe and in wetting contact therewith and forming a static first thin liquid metal interface therebetween during operation of said semiconductor device, said first thin film of metal of thickness in the range of 1/10 to 5 mils, the thin liquid metal interface not mechanically stressing the thin integral power semiconductor device-cup member unit and the high thermal and electrical conductivity of the liquid metal permitting the cooling of large diameter semiconductor devices without the need for large clamping forces to obtain high pressure joints between said heat pipe and said thin integral power semiconductor device-cup member unit, the close spacing between the first heat pipe and heat-emitting power semiconductor device and lack of pressure interfaces therebetween and in the integral power semiconductor device-cup member unit substantially decreasing the steady-state thermal resistance as well as improving the transient response of the heat-pipe cooled power semiconductor device assembly to obtain improved single-sided cooling of the device without requiring a costly and mechanically complex clamping device, and means connected only to the evaporating surface of said first heat pipe for enhancing the evaporating surface so as to increase the rate of heat transfer from the first cup-like member to the fluid coolant in said first heat pipe.

2. The heat-pipe cooled power semiconductor device assembly set forth in claim 1 and further comprising a second long nonwicked gravity-return heat pipe having an evaporating surface end wall in thermal contact with an inner bottom surface of said second cup-like member for removing heat therefrom, said second nonwicked gravity-return heat pipe comprising a second enclosed elongated hollow chamber having an evaporator section at a first end thereof respectively defined by the evaporating surface end wall and a condenser section at a second end thereof remote from the first end, a two-phase fluid coolant contained within said second chamber and being of sufficient volume in the liquid state to cause full immersion of at least the heated portion of the evaporating surface, and a static second thin film of a high thermal and electrical conductivity metal disposed external of said integral semiconductor device-cup member unit between the inner bottom surface of said second cup-like member and evaporating surface end wall of said second heat pipe and in wetting contact therewith and forming a static second thin liquid metal interface therebetween during operation of said semiconductor device, said second thin film of metal of thickness in the range of 1/10 to 5 mils, the close spacing between said first and second heat pipes as determined by the small thickness dimensions of said thin integral semiconductor device-cup member unit and first and second liquid metal interfaces and lack of pressure interfaces therebetween substantially decreasing the steady-state thermal resistance as well as improving the transient response to obtain improved double-sided cooling of the device, means connected only to the evaporating surfaces of said second heat pipe for enhancing the evaporating surface so as to increase the rate of heat transfer from the second cup-like member to the fluid coolant in said second heat pipe, and clamping means for retaining said integral power semiconductor device-cup member unit between said first and second heat pipes in a single assembly, said clamping means providing only a low clamping force which thereby results in said integral power semiconductor device-cup member unit not being stressed as when utilizing high pressure joints and being an easily removable and replaceable component.

3. The heat-pipe cooled power semiconductor device assembly set forth in claim 2 wherein said first and second thin films of metal are each of thickness in the range of 1/10 to 1 mil.

4. The heat-pipe cooled power semiconductor device assembly set forth in claim 2 wherein said first and second thin films of metal are each formed from low melting temperature eutectic alloys of combinations of particular metals.

5. The heat-pipe cooled power semiconductor device assembly set forth in claim 4 wherein the particular metals are sodium and potassium.

6. The heat-pipe cooled power semiconductor device assembly set forth in claim 4 wherein the particular metals are indium, tin, lead, antimony, bismuth and cadmium.

7. The heat-pipe cooled power semiconductor device assembly set forth in claim 2 wherein said first and second thin films of metal are each formed from a particular low melting temperature pure metal.

8. The heat-pipe cooled power semiconductor device assembly set forth in claim 7 wherein the particular metal is gallium.

9. The heat-pipe cooled power semiconductor device assembly set forth in claim 1 wherein said cup-like members are each of thickness in the range of 2 to 10 mils.

10. The heat-pipe cooled power semiconductor device assembly set forth in claim 9 wherein said cup-like members are fabricated of a metal selected from the group consisting of copper and aluminum.

11. The heat-pipe cooled power semiconductor device assembly set forth in claim 1 wherein said cup-like members are each of thickness in the range of 2 to 6 mils.

12. The heat-pipe cooled power semiconductor device assembly set forth in claim 11 wherein said cup-like members are fabricated of a metal selected from the group consisting of tungsten and molybdenum.

13. The heat-pipe cooled power semiconductor device assembly set forth in claim 1 wherein said creepage path lengthening means comprises a unitary layer of an electrically insulating material formed along outer side surfaces of said first and second cup-like members.

14. The heat-pipe cooled power semiconductor device assembly set forth in claim 13 wherein the unitary layer is of a ceramic composition, and provides a hermetic seal around said power semiconductor device.

15. The heat-pipe cooled power semiconductor device assembly set forth in claim 13 wherein the unitary layer is of a rubber composition and fills the entire void between said first and second cup-like members.

16. The heat-pipe cooled power semiconductor device assembly set forth in claim 2 wherein at least a substantial portion of each of said first and second heat pipes is oriented at an angle greater than 0° with respect to the horizontal.

17. The heat-pipe cooled power semiconductor device assembly set forth in claim 2 and further comprising a third electrical conductor connected to said power semiconductor device which is of the three electrode type.

18. The heat-pipe cooled power semiconductor device assembly set forth in claim 2 wherein the condenser sections of said chambers are provided with cooling fins along the outer surfaces thereof for increasing the rate of heat transfer to ambient air surrounding said assembly.

19. The heat-pipe cooled power semiconductor device assembly set forth in claim 2 wherein said evaporating surface enhancing means is a pair of porous metallic layer structures which are sintered to the evaporating surfaces of said heat pipes.

20. The heat-pipe cooled power semiconductor device assembly set forth in claim 19 wherein said porous metallic layer structures are each of substantially uniform thickness in the range of 10 to 50 mils.

21. The heat-pipe cooled power semiconductor device assembly set forth in claim 20 wherein said porous metallic structures are each fabricated of a metal selected from the group consisting of copper, nickel and stainless steel.

22. The heat-pipe cooled power semiconductor device assembly set forth in claim 2 wherein said evaporating surface enhancing means is an irregular surface connected to the evaporating surfaces of said heat pipes for increasing the surface area thereof.

23. The heat-pipe cooled power semiconductor device assembly set forth in claim 22 wherein said irregular surface consists of small fins formed of a heat conductive material.

24. The heat-pipe cooled power semiconductor device assembly set forth in claim 22 wherein said irregular surface consists of a plurality of small solid metallic members bonded to the evaporating surfaces of said heat pipes.

25. The heat-pipe cooled power semiconductor device assembly set forth in claim 24 wherein said small solid metallic members are circular in cross section.

26. The heat-pipe cooled power semiconductor device assembly set forth in claim 24 wherein said small solid metallic members are square in cross section.

27. The heat-pipe cooled power semiconductor device set forth in claim 24 wherein said small solid metallic members are each approximately 0.15 inch in height.

28. The heat-pipe cooled power semiconductor device set forth in claim 24 wherein said small solid metallic members are fabricated of a metal selected from the group consisting of aluminum, copper, nickel, stainless steel, molybdenum and tungsten.

* * * * *